United States Patent
Fuchs et al.

(10) Patent No.: US 8,529,781 B2
(45) Date of Patent: Sep. 10, 2013

(54) METHOD FOR PRODUCING A COMPONENT, IN PARTICULAR A MICROMECHANICAL AND/OR MICROFLUIDIC AND/OR MICROELECTRONIC COMPONENT, AND COMPONENT

(75) Inventors: Tino Fuchs, Tuebingen (DE); Christina Leinenbach, Ensdorf (DE)

(73) Assignee: Robert Bosch GmbH, Stuttgart (DE)

( * ) Notice: Subject to any disclaimer, the term of this patent is extended or adjusted under 35 U.S.C. 154(b) by 700 days.

(21) Appl. No.: 12/308,522

(22) PCT Filed: May 4, 2007

(86) PCT No.: PCT/EP2007/054345
§ 371 (c)(1),
(2), (4) Date: Aug. 11, 2010

(87) PCT Pub. No.: WO2008/000541
PCT Pub. Date: Jan. 3, 2008

(65) Prior Publication Data
US 2010/0294710 A1    Nov. 25, 2010

(30) Foreign Application Priority Data
Jun. 28, 2006  (DE) .................. 10 2006 029 622

(51) Int. Cl.
*H01L 21/311* (2006.01)
*H01L 21/302* (2006.01)
*C03C 17/09* (2006.01)
*C03C 3/32* (2006.01)
*H05H 1/24* (2006.01)
*B01D 71/00* (2006.01)

(52) U.S. Cl.
USPC ........ 216/58; 210/500.21; 210/483; 210/496; 438/694; 438/706; 216/13; 427/578; 427/577; 427/569

(58) Field of Classification Search
None
See application file for complete search history.

(56) References Cited

U.S. PATENT DOCUMENTS
| | | |
|---|---|---|
| 5,376,241 A | 12/1994 | Shor et al. |
| 2004/0033339 A1 | 2/2004 | Fukutani et al. |
| 2004/0249006 A1 | 12/2004 | Gleason et al. |

FOREIGN PATENT DOCUMENTS
| | | |
|---|---|---|
| JP | 62-54734 | 3/1987 |
| JP | 9-157062 | 6/1997 |
| JP | 11-21369 | 1/1999 |
| JP | 11-206877 | 8/1999 |
| JP | 2002-241532 | 8/2002 |
| JP | 2003-138056 | 5/2003 |
| JP | 2004-237430 | 8/2004 |

OTHER PUBLICATIONS

LaBelle et al. Pulsed plasma deposition from 1,1,2,2-tetrafluoroethane by electron cyclotron resonance and conventional plasma enhanced chemical vapor deposition. J. Applied Polymer Science, vol. 80 (2001) 2084-2092.*
Merlino, Robert. Dusty plasmas and applications in space and industry. Plasma Physics Applied (2006) 73-110.*
Nefedov et al. Formation of liquidlike and crystalline structures in dusty plamas. JETP Letters, vol. 72, No. 4 (2000) 218-226.*

* cited by examiner

*Primary Examiner* — Katherine Zalasky
(74) *Attorney, Agent, or Firm* — Kenyon & Kenyon LLP

(57) ABSTRACT

A method for producing a component, and a component, in particular a micromechanical and/or microfluidic and/or microelectronic component, is provided, the component including at least one patterned material region, and in a first step the patterned material region is produced in that microparticles of a first material are embedded in a matrix of a second material, and in a second step the patterned material region is rendered porous by etching using a dry etching method or a gas-phase etching method.

14 Claims, 1 Drawing Sheet

METHOD FOR PRODUCING A COMPONENT, IN PARTICULAR A MICROMECHANICAL AND/OR MICROFLUIDIC AND/OR MICROELECTRONIC COMPONENT, AND COMPONENT

FIELD OF THE INVENTION

The present invention is based on a method for producing a micromechanical component and on a micromechanical component.

BACKGROUND INFORMATION

To produce porous layers out of silicon and silicon carbide; the use of electrochemical anodization processes using hydrofluoric acids, for example, as an etching medium, is discussed in U.S. Pat. No. 5,376,241 A, for example. This method has decisive disadvantages, since on the one hand it requires a comparatively high electric conductivity of the layer to be porosified, and on the other hand the etching medium is present as a fluid. The relatively high electric conductivity is a severe restriction in particular for silicon carbide, since this material system can be doped only with great technical effort. The presence of the etching medium as a fluid and the associated inherent surface tension of the etching medium limits the minimum pore sizes that are able to be produced during porosification. A further disadvantage of the known porosification method is the unavoidable handling of hydrofluoric acids, which results in an enormous potential for danger.

SUMMARY OF THE INVENTION

In contrast, the method according to the present invention for producing a micromechanical component, and the micromechanical component according to the present invention, according to the independent claims corresponding to a first specific embodiment, have the advantage that it is possible to pattern a material region of the component already in the first method step, so that the patterning parameters are actually defined already in this method step, and an etching step for the selective etching of a part of the patterned material region may take place in the second method step, advantageously using a gas-phase etching step or using a dry etching method, so that negative influences on the pore size, for example, that result from the surface tension or the chemical nature of an employed liquid etching medium are absent.

According to the present invention, it may be that the patterned material region is rendered porous by etching in the second step in that the first material is selectively etched with respect to the second material, or that the second material is selectively etched with respect to the first material, and in that the microparticles of the first material are microcrystallites containing germanium or silicon germanium, and/or in that the matrix of the second material contains silicon carbide or silicon. Thus, it is advantageously possible for a porosification method to manage without electric current flow through the layer to be porosified or through the patterned material region.

According to the present invention, an etching using ClF3 etching gas is provided as a dry etching method, for example. According to the present invention, as the material combination of the first and second material, germanium material or silicon-germanium material, or corresponding microcrystallites, is/are provided as the first material, and silicon carbide as the second material, for example. Using this material combination, for example, an etching using ClF3 etching gas having a very high selectivity (etching of germanium or silicon-germanium with respect to silicon carbide of typically approximately 1063 to 1, up to more than approximately 105 to 1) is able to take place.

Furthermore, the method according to the present invention for producing a micromechanical component, and the micromechanical component according to the description herein corresponding to a second specific embodiment, or according to other exemplary variants of the first specific embodiment, have the advantage that in the first step a deposition method is used, in which the microparticles within a plasma develop from precursor reactants, the precursor reactants being gaseous, in particular.

Thus, according to the present invention, it is surprisingly possible to use advantageously the effect of what is referred to as a dusty plasma to produce the patterned material region. In this connection, crystallites or microcrystallites of the first material, which develop in the region of the electric field of such a plasma for material deposition, are deposited along with the second material, and the patterning of the patterned material region is thus achieved.

In this context, in the deposition method used in the first step for producing the patterned material region, it may particularly be that a plasma control is used for the periodic production and deposition of microparticles, in particular the size and/or the form of the microparticles being modified by a variation of the plasma control, and in particular a voltage power control being used as plasma control. In this way, the pattern parameters of the patterned material region may be controlled advantageously using relatively simple means, for example, in that the plasma or the electric field is periodically pulsed to maintain the plasma condition above the substrate of the component. In this context, according to the present invention, the pulse cycle (which subsequently is also called the duty cycle of the plasma cycle) is advantageously designed such that the on-time of the plasma is sufficient to produce sufficiently large crystallites of the first material in the plasma, and that the off-time of the plasma is sufficient for the discharge to completely cease and as a result the crystallites fall onto the matrix of the second material.

Another subject matter of the present invention is a component, in particular a micromechanical and/or a microfluid and/or a microelectronic component, able to be produced according to a method according to the present invention according to either the first or the second specific embodiment, i.e., with or without (porosifying) etching after the production of the patterned material region. In this context, it may especially be that in particular the density of the microparticles of the first material within the matrix of the second material and the size and/or the form of the microparticles are/is provided as pattern parameters of the patterned material region, and that the component has at least one additional patterned material region having pattern parameters that are set to differ from the patterned material region.

Thus, the manifold variation of the deposition conditions during the first step of the production method according to the present invention makes it possible to produce very different patterned diaphragm regions, and in particular diaphragm regions that are suitable for different uses. Furthermore, according to the present invention, it is also possible to vary the deposition conditions continuously and/or discontinuously and/or in a periodically alternating manner during the production of the patterned material region, such that different pattern parameters exist in different deposition regions.

It may particularly be that the patterned material region and/or the additional patterned material region of the component according to the present invention is provided as a chemosensoric diaphragm, in particular as an NH3-sensing diaphragm, and/or as a semipermeable diaphragm, in particular for dialysis applications, and/or as a filter, in particular for the filtering of chemically aggressive fluids, and/or as a thermally decoupling diaphragm, in particular for a microbolometer. Thus, according to the present invention, it is advantageously possible to develop a multitude of possible uses for the patterned material region or for the porosified patterned material region. Accordingly, another subject matter of the present invention is the use of a component according to the present invention as a chemical sensor and/or as a diaphragm and/or as a filter and/or as a sensor, which further increases the possibilities for using the component according to the present invention.

Exemplary embodiments of the present invention are shown in the drawing and explained in greater detail in the following description.

DETAILED DESCRIPTION

Figure 1:
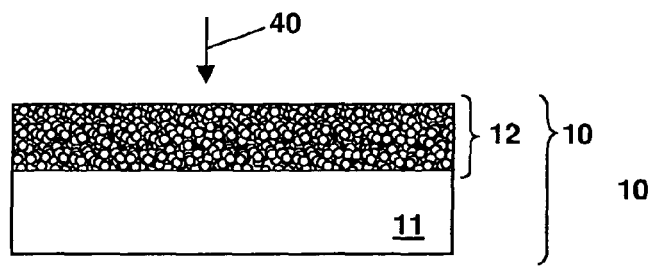
FIG. 1 shows a schematic cross-sectional representation of a component according to the present invention according to a second specific embodiment of it.
Figure 2:
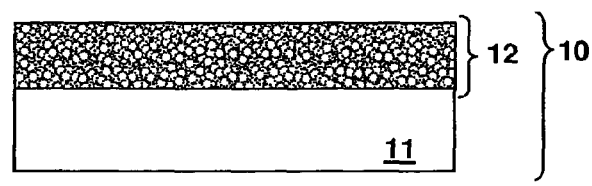
FIG. 2 shows a schematic cross-sectional representation of the component according to the present invention according to a first specific embodiment thereof.
Figure 3:
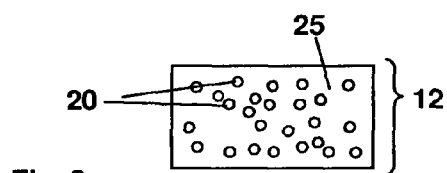
FIG. 3 shows a schematic cross-sectional representation of a detailed representation of a patterned material region of the component according to the present invention.

FIG. 1 illustrates a schematic cross-sectional representation through a component 10 according to the present invention according to a second specific embodiment of the invention, and FIG. 2 according to a first specific embodiment of the present invention. In both specific embodiments, component 10 includes a patterned material region 12. This patterned material region 12 is illustrated in FIG. 3 in a detailed representation in a schematic cross-sectional illustration. In this connection, patterned material region 12 is provided in such a manner that microparticles 20 (which subsequently are also called particles 20) are embedded in a matrix 25. Microparticles 20 include essentially a first material, and matrix 25 includes essentially a second material. Furthermore, a substrate 11 contained by component 10, as an example, is in both FIG. 1 and in FIG. 2.

The difference between the first specific embodiment (FIG. 2) and the second specific embodiment (FIG. 1) is that in the first specific embodiment (FIG. 2) an etching either of the first material (that is, microparticles 20) relative to the second material (that is, matrix 25), or vice versa of the second material relative to the first material has taken place, while in the second specific embodiment (FIG. 1) no such etching has been carried out. The etching carried out in the first specific embodiment of component 10 according to the present invention is indicated in FIG. 2 by a dashed or dotted representation of the individual microparticles 20 within patterned material region 12. In this context, patterned material region 12 subsequently is called patterned material region 12 both with and without the etching carried out, because the pattern generated in patterned material region 12 by the embedding of particles 20 in matrix 25 exists both without etching and also with a selective etching either of particles 20 with respect to matrix 25 (or vice versa).

Figure 4:
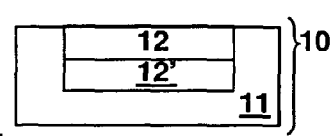
FIG. 4 shows a schematic representation(s) of a variant(s) of the patterned material region in a component according to the present invention.
Figure 5:
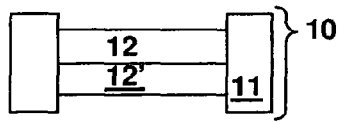
FIG. 5 shows a schematic representation(s) of a variant(s) of the patterned material region in a component according to the present invention.

FIGS. 4 and 5 show different variants of systems of patterned material region 12 or of substrate 11 within component 10. In this connection, the possibility of an additional patterned material region 12' existing in addition to patterned material region 12 is shown as well. In this connection, within the scope of the present invention, an additional patterned material region 12' is understood to mean in particular a material region that has other pattern parameters with regard to its patterning (of particles 20 within matrix 25), that is, for example, such that particles 20 are larger or have another form, or even that particles 20 indeed exist in the same size, but distributed at a lower density (within matrix 25).

Figure 6:
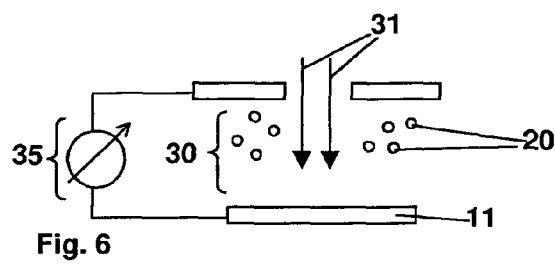
FIG. 6 is a schematic representation of a device for the production of the component, and the method according to the present invention for the production of the component.

The method according to the present invention for producing patterned material region 12 both according to the first specific embodiment and according to the second specific embodiment of component 10 is shown in FIG. 6 by showing schematically a system for carrying out the first step according to the production method. According to the first step of the method according to the present invention, patterned material region 12 is produced by embedding microparticles 20 of the first material in matrix 25 of the second material. If a porosification of patterned material region 12 is subsequently desired, according to the present invention, the desired etching may be performed using a gas-phase etching method (or a dry etching method) in a second method step, without the disadvantages of a wet-chemical etching method occurring. This possibility is indicated in FIG. 1 by an arrow and reference numeral 40, which labels the etching medium or etching gas 40.

The method according to the present invention is subsequently described exemplarily primarily using the example of the embedding of germanium microparticles 20 or of silicon-germanium microparticles 20 in a matrix 25 including predominantly silicon carbide. However, according to the present invention, it is also possible for other material combinations of microparticles 20 and matrix 25 to be selected.

According to the first step of the method according to the present invention, patterned material region 12 is produced as an embedding of germanium microparticles or silicon-germanium microparticles 20 or microcrystallites 20 in a matrix 25 of amorphous silicon carbide, for example. (After an etching of microparticles 20 in the second method step, it is possible to cause a conversion of the porous amorphous silicon carbide into porous polycrystalline silicon carbide, by using a thermal method step (not shown)—for example, by using so-called rapid thermal processing.)

A PECVD process (plasma enhanced chemical vapor deposition) is used to produce patterned material region 12 according to the present invention, for example. In this process, the substances that form layers in the course of the deposition method or coating method (which are subsequently referred to also as precursor reagents 31 or also as precursors 31) may be supplied in gaseous form. This is indicated in FIG. 6 by two arrows at precursors 31. For example, germane ($GeH_4$), and germane ($GeH_4$) and silane ($SiH_4$), respectively, may be provided as layer-forming precursors 31 for germanium microparticles and silicon-germanium microparticles 20, respectively, while silane ($SiH_4$) and methane ($CH_4$) may be provided as precursors 31 for matrix 25 containing silicon carbide. For example, according to the exemplary embodiments and/or exemplary methods of the present invention, these precursors 31 are supplied simultaneously to a plasma discharge, the region of a plasma being indicated in FIG. 6 by reference numeral 30. According to the exemplary embodiments and/or exemplary methods of the present invention, all silicon hydrocarbons (SikCmHn) and their compounds or isomers, may be considered as additional examples of precursors 31 for the formation of silicon carbide.

Furthermore, FIG. 6 shows that during the production of patterned material region 12, a voltage for producing plasma 30 may be applied to substrate 11 and to electrodes (in FIG. 6 not labeled by reference numerals), for example. In this connection, usual plasma-coating systems, for example, a capacitive parallel plate reactor or also an inductively coupled source (ICP, inductively coupled plasma)—for example, having illustrated substrate electrodes—may be used. According to the exemplary embodiments and/or exemplary methods of the present invention, the large difference in the crystal binding energies between different materials may be used to form patterned material region 12. For example, crystal binding energies for silicon carbide amount to approximately 5 eV and for germanium and silicon-germanium approximately 2 eV, which means that at typical process temperatures of approximately 300° C., for example, silicon carbide grows in an amorphous phase, while the temperature of the substrate and the energy from the plasma are already sufficient for the formation of germanium microcrystallites and silicon-germanium microcrystallites (first in the plasma), which are subsequently embedded in the matrix of amorphous silicon carbide. According to the exemplary embodiments and/or exemplary methods of the present invention, it is surprisingly possible to use advantageously so-called dusty plasmas, which until now were viewed rather as a disadvantage in the deposition of material layers, to produce patterned material region 12. In this context, crystallites 20 or microcrystallites 20 of the first material, which form in the region of such a plasma 30, are deposited along with the second material, whereby the patterning of patterned material region 12 is achieved. It is namely the case that low-pressure plasmas containing silane or germane, for example, tend to form particles in the plasma (dusty plasma). These particles are crystallites having sizes in the range of a few nanometers up to one or multiple micrometers, which crystallites form in the volume of the discharge, since they develop a negative electric charge through the free electrons of the gas discharge (or of plasma 30), and which are quasi held suspended in the electric layer (space charge zone) between plasma 30 and substrate 11, or substrate electrode 11 by the power of this electric charge.

There, they grow (when plasma 30 is turned on) until they are heavy enough to fall (because of gravity) onto substrate 11. According to the exemplary embodiments and/or exemplary methods of the present invention, this dusty plasma effect is advantageously used to embed microparticles 20 in matrix 25. To this end, according to the exemplary embodiments and/or exemplary methods of the present invention, plasma 30 may either remain permanently turned on (and the gravity-related coating process or embedding process of particles 20 may be used) or plasma 30 may be pulsed, that is, periodically turned on and off, so that the formation of particles 20 and their size may be adjusted via the on-time, and the embedding of particles 20 in matrix 25 may take place via the off-time. To this end, a plasma control 35—in particular, as an output voltage control of the discharge voltage—is indicated in FIG. 6.

The crystallization of germanium or of silicon germanium may be accelerated by adding hydrogen (not shown in FIG. 6) to the discharge or to plasma 30 according to the present invention. Thus, according to the exemplary embodiments and/or exemplary methods of the present invention, the size distribution of germanium microcrystallites or of silicon-germanium microcrystallites 20 may be selectively controlled via the hydrogen content and the injected (impressed) power of plasma 20. By this means, during the first step of the method according to the present invention, the coating conditions of plasma 30 may be used to set or control in a simple manner in particular the size of microcrystallites 20 or of particles 20 as an essential pattern parameter of patterned material region 12. According to the exemplary embodiments and/or exemplary methods of the present invention, for example, argon, but also all other inert gases, such as helium, neon or nitrogen, for example, could be used as an additional carrier gas for the plasma discharge.

Depending on the type or the system of supplying precursors 31, according to the exemplary embodiments and/or exemplary methods of the present invention it is also possible to influence additional pattern parameters of particles 20 and thus of patterned material region 12. For example, in this manner it is possible to vary the form of particles 20 and/or the density of particles 20 (as the number of particles per substrate surface). Furthermore, according to the exemplary embodiments and/or exemplary methods of the present invention, is possible for a lateral modification of the plasma conditions to lead to a lateral modification of the pattern parameters of patterned material region 12.

A vertical differentiation between different regions of patterned material region 12 or between different material regions 12, 12' that are adjacent to each other may be produced according to the present invention via a so-called parameter ramping, i.e., a temporal modification of the plasma conditions such that as coating time increases and thus also the layer thickness of patterned material region 12 different coating conditions exist in the plasma and thus also different pattern parameters in different regions of patterned material region 12. Such a parameter ramping may take place, for example, in the gas inflows or gas flows of precursors 31 and/or in the electric parameters of the discharge and/or in the discharge pressure. It is thus possible to set, for example; a particle-size distribution that is variable via the layer thickness of patterned material region 12, which means that various pore sizes also form during the etching procedure in the second method step.

As an alternative to the production of germanium crystallites 20 or of silicon-germanium crystallites 20 in a matrix 25 of predominantly silicon carbide, according to the exemplary embodiments and/or exemplary methods of the present invention, it is also possible for amorphous porous silicon to be used as matrix 25. In this case, germanium crystallites 20 or silicon-germanium crystallites 20 may also be embedded in this matrix 25. Also, in this case it is possible to porosify patterned material region 12 by etching using a dry etching method and thus to obtain (amorphous) porous silicon, this being possible in particular through the high etching selectivity (of approximately 1 to 4000 (for example, in an etching using ClF3)) between silicon on the one hand, and germanium or silicon-germanium on the other hand.

What is claimed is:
1. A method for producing one of a micromechanical component, a microfluidic component and a microelectronic component, the method comprising:
  producing a patterned material region on the component,
    wherein microparticles of a first material are embedded in a matrix of a second material by deposition, wherein the microparticles develop from precursors within a dusty plasma, and wherein the precursors are gaseous; and rendering porous the patterned material region by etching using one of a dry etching and a gas-phase etching.

2. The method of claim 1, wherein in the rendering, the patterned material region is rendered porous by etching in that one of (i) the first material is selectively etched with respect to the second material, and (ii) the second material is selectively etched with respect to the first material.

3. The method of claim 1, wherein at least one of the following is satisfied: (i) the microparticles of the first material are microcrystallites containing one of germanium and silicon germanium, and (ii) the matrix of the second material contains one of silicon carbide and silicon.

4. The method of claim 1, wherein in the rendering, the patterned material region is rendered porous by etching in that one of (i) the first material is selectively etched with respect to the second material, and (ii) the second material is selectively etched with respect to the first material, and wherein at least one of the following is satisfied: (i) the microparticles of the first material are microcrystallites containing one of germanium and silicon germanium, and (ii) the matrix of the second material contains one of silicon carbide and silicon.

5. The method of claim 1, wherein in the rendering, the patterned material region is rendered porous by etching in that the first material is selectively etched with respect to the second material.

6. The method of claim 1, wherein the microparticles of the first material are microcrystallites containing one of germanium and silicon germanium.

7. The method of claim 1, wherein in the rendering, the patterned material region is rendered porous by etching in that the second material is selectively etched with respect to the first material.

8. The method of claim 1, wherein the matrix of the second material contains one of silicon carbide and silicon.

9. The method of claim 1, wherein the microparticles of the first material are microcrystallites containing germanium.

10. The method of claim 1, wherein the matrix of the second material contains silicon carbide.

11. The method of claim 1, wherein the microparticles of the first material are microcrystallites containing silicon germanium.

12. The method of claim 1, wherein the matrix of the second material contains silicon.

13. A method for producing one of a micromechanical component, a microfluidic component and a microelectronic component, having at least one patterned material region, the method comprising:

using a deposition process to develop microparticles from precursors within a dusty plasma, wherein the precursors are gaseous; and producing the patterned material region by embedding the microparticles of a first material in a matrix of a second material.

14. The method of claim 13, wherein a plasma control for periodically producing and depositing the microparticles is used in the deposition to produce the patterned material region, wherein at least one of a size and a form of the microparticles is modified by varying the plasma control, and wherein a voltage control is used as the plasma control.

* * * * *

UNITED STATES PATENT AND TRADEMARK OFFICE
CERTIFICATE OF CORRECTION

PATENT NO. : 8,529,781 B2  Page 1 of 1
APPLICATION NO. : 12/308522
DATED : September 10, 2013
INVENTOR(S) : Fuchs et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1243 days.

Signed and Sealed this
Fifteenth Day of September, 2015

Michelle K. Lee
*Director of the United States Patent and Trademark Office*